United States Patent [19]

Kusano

[11] 4,136,356

[45] Jan. 23, 1979

[54] WIRING SUBSTRATE FOR A MATRIX CIRCUIT

[75] Inventor: Masaaki Kusano, Yokohama, Japan

[73] Assignee: Hitachi, Ltd., Japan

[21] Appl. No.: 824,094

[22] Filed: Aug. 12, 1977

[30] Foreign Application Priority Data

Aug. 16, 1976 [JP] Japan .................................. 51-97072

[51] Int. Cl.² ............................................. H01L 23/48
[52] U.S. Cl. ......................................... 357/70; 357/68;
357/69; 357/45; 357/71
[58] Field of Search ....................... 357/70, 71, 68, 69,
357/45

[56] References Cited

U.S. PATENT DOCUMENTS

| 3,868,724 | 2/1975 | Perrino | 357/71 |
| 4,021,838 | 5/1977 | Warwick | 357/70 |
| 4,023,197 | 5/1977 | Magdo et al. | 357/71 |

Primary Examiner—Edward J. Wojciechowicz
Attorney, Agent, or Firm—Craig & Antonelli

[57] ABSTRACT

A wiring substrate for a matrix circuit constituted by mounting a plurality of semiconductor chips in a multichip configuration, in which wiring conductors for interconnecting terminal electrodes of the individual chips and terminals of incoming and outgoing lines of the matrix circuit consist of first wiring conductors each for interconnecting the terminal electrodes of adjacent two chips and second wiring conductors for interconnecting the first wiring conductors at their middle portions, whereby the wiring lengths of the wiring conductors through any chips are made substantially equal to one another, thereby to establish uniform resistance among the wiring conductors for the chips with the width of the wiring conductors maintained constant.

7 Claims, 6 Drawing Figures

WIRING SUBSTRATE FOR A MATRIX CIRCUIT

LIST OF PRIOR ART REFERENCES (37 CFR 1.56 (a))

The following reference is cited to show the state of the art:
Japanese Patent Application Laid-open No. 42,611/73 (filed in the name of Motorola Incorporated and laid open on June 21, 1973) corresponding to U.S. Pat. application Ser. No. 184081.

The present invention relates in general to a wiring substrate for circuits employed in communication apparatus such as telephone exchanges or the like and in particular to a wiring substrate for multi-chip integrated circuits in a matrix configuration.

For the speech path switches of communication systems including the telephone exchanges as well as other various electronic parts inserted in transmission paths, it is required that unevenness in the resistance among these parts in the operative or conducting (on) states thereof should be avoided as much as possible. For example, in the case of speech path switches for a telephone exchange, the unevenness in the resistance among these switches in the operating or "on" state thereof is in general required to lie in the range of several to ten percents in consideration of the quality of speech. For processing video signals, such unevenness in the resistance among associated electric parts should be obviously much more reduced.

In the case of a speech path switch arrangement implemented in a matrix configuration, the path length between the incoming and outgoing line terminal electrodes will usually differ remarkably in dependence on coordinate position of the cross or intersecting points in the matrix. For the speech path switch matrix utilizing mechanical contacts at the intersecting points, no problems will occur in respect of the unevenness in the resistance among the contacts in the on-state thereof, since the resistance of conductors or wires interconnecting the contacts can be made substantially uniform on the order of several hundreds mΩ. However, when semiconductor switches such as PNPN-type semiconductor switch devices are employed at intersecting points of the matrix, a wiring substrate therefor is required and the unevenness in the resistance among these semiconductor switches will be remarkably large, because the resistance of the individual semiconductor elements as well as the resistance of the conductors in the substrate are relatively high (e.g. the resistance of a semiconductor switch element being about several ohms, and that of the substrate being about 0.5 to 1 ohm). Particularly, when a large number of semiconductor switches are to be arranged at a correspondingly large number of intersecting points in a matrix, a plurality of semiconductor chips have to be mounted on one and the same substrate in the form of a multi-chip package. Under such circumstance, the lengths of conductors or wires constituting respective speech paths in the matrix will be different in dependence upon the positions of the associated chips, with the result that remarkable unevenness in the resistance among the established speech paths occurs.

It is known that such a drawback described above can be suppressed by varying the widths of the individual wiring conductors, as disclosed in Japanese Pat. application Laid-open No. 42611/1973. However, it is difficult in practice to vary freely the width of the conductors, because the wiring density is increased by a large number of multi-wiring conductors both in the row or X direction and in the column or Y direction for constituting speech paths as well as by wirings for control signals.

An object of the invention is to provide a wiring substrate for a matrix circuit in which differences among wire lengths between intersecting points in the matrix are decreased to a minimum so that the resistances of wiring conductors between intersecting points are almost equal to one another.

Another object of the invention is to provide a wiring substrate which allows the wiring in the matrix to be realized at a high wiring density.

With the above and other objects in view, there is provided according to an aspect of the invention a wiring substrate for a matrix circuit constituted by mounting a plurality of semiconductor chips in a multi-chip configuration, wherein wiring conductors for interconnecting terminal electrodes of the chips and terminals of incoming and outgoing lines of the matrix circuit consist of first wiring conductors each for interconnecting the terminal electrodes of adjacent two semiconductor chips, and second wiring conductors for interconnecting the first wiring conductors at their middle portions.

The above and other objects, features and advantages of the invention will become more apparent from the detailed description of exemplary embodiments of the invention taken in conjunction with the accompanying drawings in which:

FIG. 2b is a sectional view taken along the line IIb—IIb in FIG. 2a;

Figure 3:
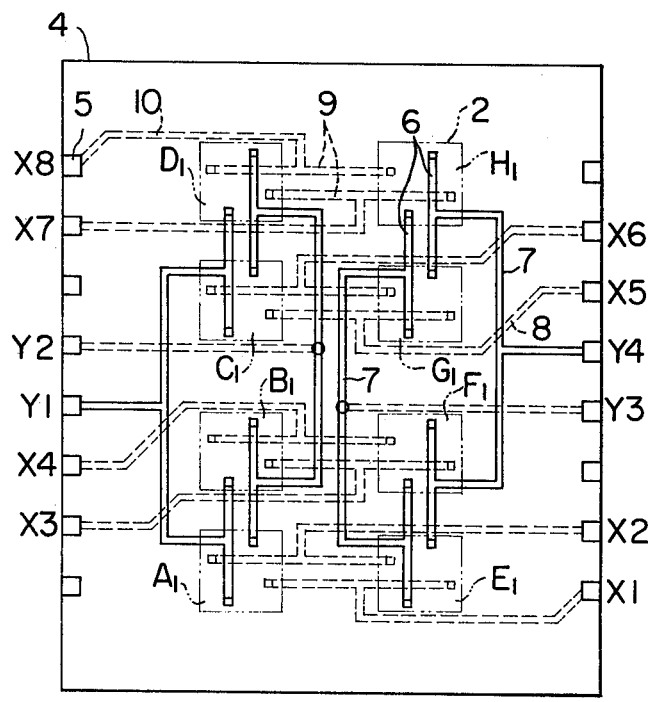
Figure 4:
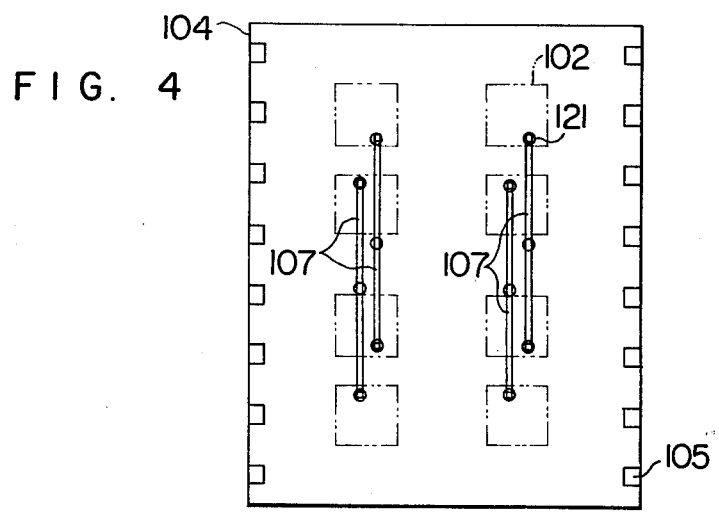
Figure 5:
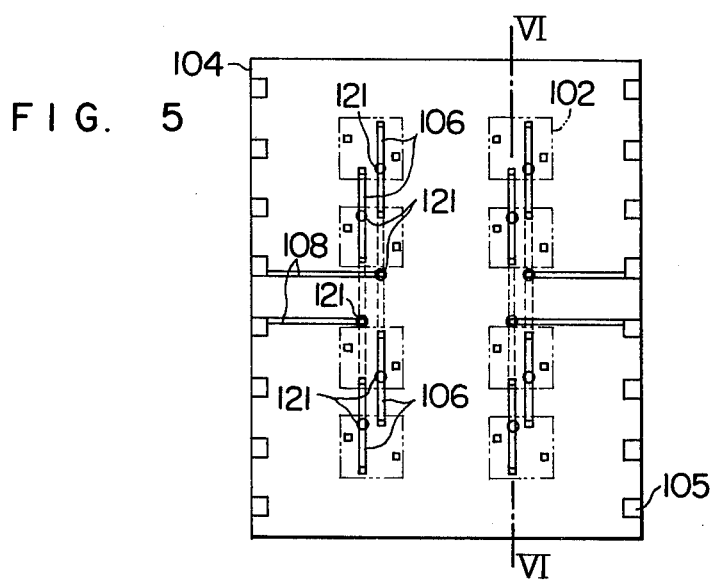
Figure 6:
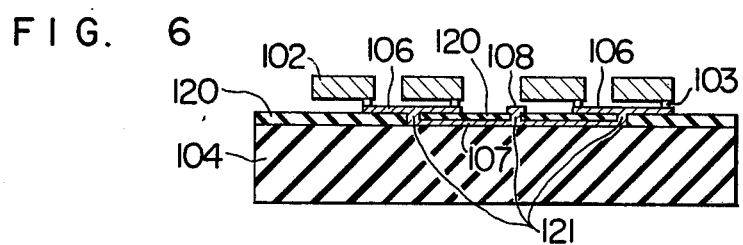

FIG. 3 is a plan view showing a wiring substrate for a matrix circuit according to one embodiment of the present invention; and FIGS. 4 to 6 are views showing a wiring substrate for a matrix circuit according to another embodiment of the present invention, in which FIG. 4 particularly illustrates a plan view first wiring conductors, FIG. 5 is a plan view of the wiring substrate according to the second embodiment and FIG. 6 is a sectional view taken along line VI—VI shown in FIG. 5.

Figure 1:
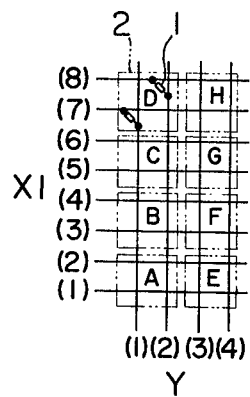
FIG. 1 is a diagram showing an example of a matrix circuit.
Figure 2A:
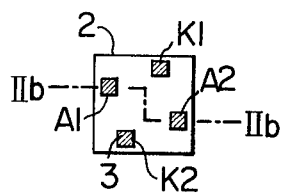
FIG. 2a is a plan view of one of the semiconductor chips shown in FIG. 1.
Figure 2B:
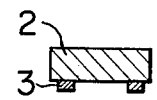

Referring to FIG. 1 showing an example of a matrix circuit, numeral 1 denotes intersection elements such as PNPN-switching elements located at intersecting points in a matrix circuit arrangement of, for example, eight incoming lines (X) by four outgoing lines (Y). In this Figure, each of the blocks A, B, C, D, E, F, G and H enclosed by two-dot chain lines is formed by a semiconductor chip 2. FIGS. 2a and 2b show in plan and sectional views a single semiconductor chip 2 including the intersection element 1, FIG. 2b being a view taken along the line IIb—IIb in FIG. 2a.

In FIGS. 2a and 2b, reference numeral 3 denotes bumps through which the semiconductor chip 2 is bonded to the wiring substrate through face bonding or face-down bonding. Symbols $A_1$ and $A_2$ denote terminal electrodes for incoming lines X, for example, while $K_1$ and $K_2$ denote terminal electrodes for the outgoing lines Y.

Referring to FIG. 3 which shows an exemplary embodiment of a wiring substrate for a matrix circuit in accordance with an embodiment of the invention, blocks $A_1$, $B_1$, $C_1$, $D_1$, $E_1$, $F_1$, $G_1$ and $H_1$ shown therein correspond, respectively, to the blocks A, B, C, D, E, F, G and H of the semiconductor chip 2 shown in FIG. 1. The substrate 4 may be made of a ceramic and has at its periphery a plurality of terminal electrodes 5 to which lead terminals (not shown) are connected. Numerals 6 and 7 represent wiring conductors shown by solid lines and numerals 8, 9 and 10 represent wiring conductors shown by broken lines. It will be appreciated from FIG. 3 that the wiring conductors 6 and 7 and the wiring conductors 8, 9 and 10 are at two different stages or levels, thus constituting a double layer wiring structure.

In the case of the illustrated embodiment, wirings for multiple interconnections for the semiconductor chips $A_1$, $B_1$, $C_1$ and $D_1$ and for the semiconductor chips $E_1$, $F_1$, $G_1$ and $H_1$ are constituted by first wiring conductors 6 for interconnecting two adjacent semiconductor chips $A_1$ and $B_1$, $C_1$ and $D_1$, $E_1$ and $F_1$, and $G_1$ and $H_1$, respectively, and second wiring conductors 7 for interconnecting the first wiring conductors at their middle points. Additionally, wiring conductors 8 are provided between the peripheral terminal electrodes 5 and the second wiring conductors 7 as led out from the middle points of the latter. Wiring conductors 9 and 10 are provided in a similar manner as described above in connection with the conductors 8.

FIGS. 5 and 6 show another embodiment of the invention in a plan view and a sectional view taken along the line VI—VI in FIG. 5, respectively. In the case of this embodiment, those corresponding to the second wiring conductors 7 for interconnecting the first conductors 6 at the middle portion thereof are formed at a stage different from that of the wiring conductors 6 as viewed in a cross-section, and the multiple interconnections among the semiconductor chips may be made along and on substantially same lines. In more detail, a first pattern of layers or first wiring conductors at a first stage are illustrated in FIG. 4, from which it will be seen that first wiring conductors 107 corresponding to the interconnecting conductors for Y lines are formed in a lower layer on the ceramic substrate 104 with an insulation layer 120 being formed thereon. The second wiring conductors or chip connecting conductors 106 for interconnecting two adjacent semiconductor chips as well as leading-out wiring conductors 108 extending to the peripheral terminal electrodes 105 as shown in solid lines in FIG. 5 are formed on the insulating layer 120. In FIG. 5, the broken lines represent the position of the wiring conductors 107 for the Y lines formed in the lower layer. It will be understood that a similar wiring pattern is taken for the wiring conductors for the X lines, although illustration thereof is omitted for the clarity of the illustration.

It will be seen that both the second wiring conductors 106 for interconnecting adjacent chips and the leading-out conductors 108 are connected to the first wiring conductors 107 by means of through-hole connections 121 through the insulation layer 120 at positions corresponding to the middle points of the conductors 106, as is shown in FIG. 6.

The structures of wiring substrate as described above may be implemented through conventional ceramic thick film wiring technic such as thick film multi-layer printing method or laminating method of stacking together ceramic sheets each provided with wiring conductors.

As will be appreciated from the foregoing description, the present invention provides a wiring substrate for a matrix circuit of a multi-chip arrangement in which wiring conductors for interconnecting terminal electrodes of the individual semiconductor chips consists of first wiring conductors for interconnecting two adjacent chips and second wiring conductors for interconnecting the first wiring conductors at the middle points thereof. With such arrangement, unevenness in the conductor path lengths among the individual intersecting points can be reduced to a minimum, which in turn means that the conductor resistance among the intersecting points can be made substantially equal to one another. The wiring substrate according to the invention thus can be advantageously used for the speech path switches in a telephone exchange with a well stabilized speech quality.

In the double layer structure of the wiring substrate according to the teachings of the invention as described above, the wiring conductors may be arranged on and along the same straight lines as viewed in a plan view, which allows a wiring substrate for a matrix circuit to be easily implemented with a high wiring density without requiring any additional manufacturing steps. It should be finally noted that the invention can be applied not only to thin film circuits and thick film printed circuits using a ceramic, but also equally applied to conventional printed circuit boards and other various wiring substrates.

What is claimed is:

1. A wiring substrate for a matrix circuit including a plurality of semiconductor chips having incoming and outgoing electrodes in multi-chip configuration and incoming and outgoing lines to be connected to the electrodes of said semiconductor chips, comprising: incoming and outgoing line multi-wiring conductors for interconnecting the electrodes of said semiconductor chips associated with the same incoming and outgoing lines; incoming and outgoing line terminal electrodes; and conductor means for connecting said terminal electrodes with the middle portions intermediate the ends of the associated ones of said multi-wiring conductors.

2. A wiring substrate as set forth in claim 1, in which among said multi-wiring conductors at least incoming line multi-wiring conductors include first wiring conductors each for connecting the electrodes of two adjacent chips associated with a respective incoming line and second wiring conductors each for interconnecting the middle portions intermediate the ends of two adjacent first wiring conductors, the middle portion intermediate the ends of said second wiring conductors being connected to said conductor means.

3. A wiring substrate for a matrix circuit as set forth in claim 2, wherein said first wiring conductors and said second wiring conductors are provided separately in upper and lower layers, respectively, for wiring incoming lines of said matrix circuit.

4. A wiring substrate for a matrix circuit as set forth in claim 2, wherein said first and second wiring conductors are separately provided in two layers at least partly superposed through an insulation layer and connected to one another by through-hole connection, whereby said first and second wiring conductors are located on superposed straight lines.

5. A wiring substrate as set forth in claim 1, in which among said multi-wiring conductors at least outgoing line multi-wiring conductors include first wiring conductors each for connecting the electrodes of two adjacent chips associated with a respective outgoing line and second wiring conductors each for interconnecting the middle portions intermediate the ends of two adjacent first wiring conductors, the middle portion intermediate the ends of said second wiring conductors being connected to said conductor means.

6. A wiring substrate for a matrix circuit as set forth in claim 5, wherein said first wiring conductors and said second wiring conductors are provided separately in upper and lower layers, respectively, for wiring outgoing lines of said matrix circuit.

7. A wiring substrate for a matrix circuit as set forth in claim 5, wherein said first and second wiring conductors are separately provided in two layers at least partly superposed through an insulation layer and connected to one another by through-hole connection, whereby said first and second wiring conductors are located on superposed straight lines.

* * * * *